(12) United States Patent
Lee et al.

(10) Patent No.: US 8,236,686 B2
(45) Date of Patent: Aug. 7, 2012

(54) DUAL METAL GATES USING ONE METAL TO ALTER WORK FUNCTION OF ANOTHER METAL

(75) Inventors: Byoung H. Lee, Austin, TX (US); Sang Ho Bae, Seoul (KR); Kisik Choi, Hopewell Junction, NY (US); Rino Choi, Seoul (KR); Craig Huffman, Krugerville, TX (US); Prashant Majhi, Austin, TX (US); Jong Hoan Sim, Austin, TX (US); Seung-Chul Song, Austin, TX (US); Zhibo Zhang, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 12/129,984

(22) Filed: May 30, 2008

(65) Prior Publication Data

US 2009/0294867 A1  Dec. 3, 2009

(51) Int. Cl.
*H01L 21/44* (2006.01)

(52) U.S. Cl. ........ 438/658; 438/195; 438/275; 438/592; 438/652; 257/E21.637

(58) Field of Classification Search .................. 438/188, 438/195, 199, 275, 279, 283, 587, 591, 592, 438/652, 656, 658; 257/369, E21.204, E21.637, 257/E27.062, E29.16
See application file for complete search history.

(56) References Cited

U.S. PATENT DOCUMENTS

| | | | |
|---|---|---|---|
| 6,291,282 B1 | 9/2001 | Wilk et al. | |
| 6,303,418 B1 | 10/2001 | Cha et al. | |
| 6,794,281 B2 | 9/2004 | Madhukar et al. | |
| 7,122,414 B2 | 10/2006 | Huotar | |
| 7,494,859 B2* | 2/2009 | Cho et al. | 438/199 |
| 2004/0238859 A1* | 12/2004 | Polishchuk et al. | 257/274 |
| 2005/0258468 A1* | 11/2005 | Colombo et al. | 257/314 |
| 2009/0152636 A1* | 6/2009 | Chudzik et al. | 257/369 |
| 2009/0258484 A1* | 10/2009 | Peidous et al. | 438/592 |

* cited by examiner

*Primary Examiner* — Matthew Landau
*Assistant Examiner* — Colleen E Snow
(74) *Attorney, Agent, or Firm* — Hoffman Warnick LLC; Anthony J. Canale

(57) ABSTRACT

Methods of forming dual metal gates and the gates so formed are disclosed. A method may include forming a first metal (e.g., NMOS metal) layer on a gate dielectric layer and a second metal (e.g., PMOS metal) layer on the first metal layer, whereby the second metal layer alters a work function of the first metal layer (to form PMOS metal). The method may remove a portion of the second metal layer to expose the first metal layer in a first region; form a silicon layer on the exposed first metal layer in the first region and on the second metal layer in a second region; and form the dual metal gates in the first and second regions. Since the gate dielectric layer is continuously covered with the first metal, it is not exposed to the damage from the metal etch process.

14 Claims, 2 Drawing Sheets

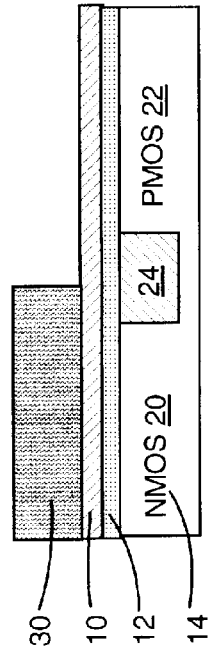
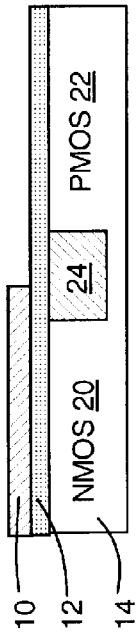
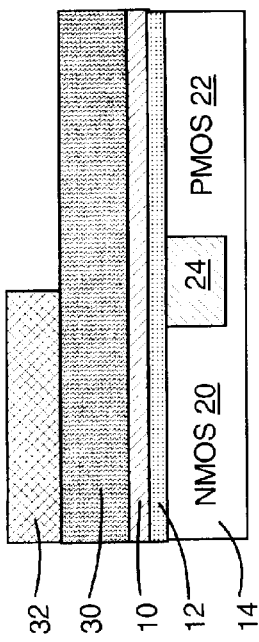
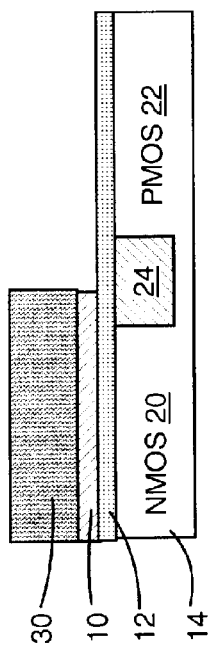
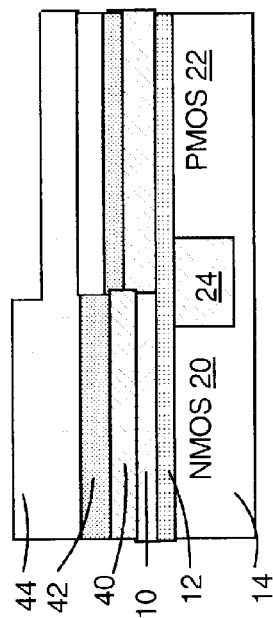
FIG. 1A PRIOR ART
FIG. 1B PRIOR ART
FIG. 1C PRIOR ART
FIG. 1D PRIOR ART
FIG. 1E PRIOR ART

DUAL METAL GATES USING ONE METAL TO ALTER WORK FUNCTION OF ANOTHER METAL

BACKGROUND OF THE INVENTION

1. Technical Field

The invention relates generally to semiconductor device fabrication, and more particularly, to methods of forming and a resulting dual metal gate using one metal to alter a work function of another metal.

2. Background Art

Recently, there has been substantial interest in replacing polysilicon gate conductors with metal gate electrodes, so that the gate conductor is a metal in both n-type and p-type metal oxide semiconductor (NMOS and PMOS) devices. In order to provide appropriate threshold voltages in the two types of devices, two different metals are typically needed. In addition, the NMOS and PMOS devices require metals with different work functions. The "work function" of a material is a measurement of how much energy is required to extract an electron from the material by moving the electron in the solid from the Fermi level to the vacuum level, i.e., to outside of the solid.

Conventionally, the two metals used are selected based on their work function and ease of integration in terms of wet and dry etching depending on the method of implementation. There are several different integration schemes used to realize two different metal layers on the same wafer to form dual metal gates. Referring to FIGS. 1A-1E, one of the most simple and well accepted schemes is illustrated. As shown, in a first step, a first metal layer 10 is deposited over a gate dielectric layer 12. Both layers 10, 12 are over a substrate 14 having an NMOS region 20 separated from a PMOS region 22 by a trench isolation 24. First metal layer 10 can be an NMOS metal or a PMOS metal, primarily depending on the ease of removal possible without damaging an underlying gate dielectric layer 12. Usually the NMOS metal (e.g., tantalum silicon nitride (TaSiN), titanium nitride (TiN), tantalum nitride (TaN)) has a work function close to the silicon conduction band and exhibits a tendency towards dissolution in common wet chemistries such as a sulfuric peroxide mixture (SPM), SC1 ($NH_4OH:H_2O_2:H_2O$ mixture) or hydrogen peroxide ($H_2O_2$). On the other hand, PMOS metals (e.g., ruthenium (Ru), molybdenum (Mo), tungsten (W), platinum (Pt)) have work functions close to the silicon valence band and are more inert and difficult to etch in wet chemistries that are typically used in normal microelectronic fabrication. Due to the ease of wet etching, the NMOS metal is usually used as first metal layer 10. The following description is based on that assumption.

Next, as shown in FIGS. 1A-1D, first metal 10 is selectively etched away over a region 20 or 22 (PMOS region 22 as shown) to gate dielectric layer 12. Since the metal removal process attacks typical photo resist materials, a lithography process is used to open PMOS region 20 using (hard) masking material 30 such as an amorphous silicon layer. In particular, a masking material 30 is deposited and a photoresist 32 is patterned and etched, as shown in FIG. 1A. Further, etching patterns masking material 30, as shown in FIG. 1B. As shown in FIG. 1C, masking material 30 is then used to etch first metal 10 over PMOS region 22. Masking material 30 has a high wet etch selectivity with respect to first metal 10 and gate dielectric layer 12. FIG. 1D shows first metal 10 remains over NMOS region 20, but is removed over PMOS region 22 selective to gate dielectric layer 12. As also shown in FIG. 1D, masking material 30 is removed. As shown in FIG. 1E, depositing a second, PMOS metal 40, a capping layer 42 and a polysilicon 44 are next. Conventionally, as shown in FIG. 1E, second metal 40 is deposited both on PMOS region 22 and NMOS region 20, and does not have to be removed over NMOS region 20 because first metal 10 is contacting gate dielectric layer 12 where the work function is primarily determined. Subsequent processing (not shown) patterns the gates from this material.

A number of challenges are presented by these processes. As shown in FIGS. 1C-1D, first metal 10 needs to be selectively removed from PMOS region 22 without damaging the underlying gate dielectric layer 12. Conventional photoresists, however, cannot be used for masking material 30 because first metal 10 etch chemistries, e.g., SPM, SC1, $H_2O_2$, etc., tend to etch masking material 30 with too high of an etch rate. In addition, when the photoresist masking material 30 is removed using wet etching, it is difficult to preserve first metal 10. Furthermore, as shown in FIG. 1D, gate dielectric layer 12 is continuously exposed to the wet chemical during masking material 30 removal, which may remove significant amounts of gate dielectric layer 12, especially if it contains silicon oxide. As photoresists cannot serve as masking material 30 during first metal 10 etch, other materials such as silicon oxide or silicon nitride have been used with some success. However, removing silicon oxide or silicon nitride based masking materials from gate dielectric layer 12, which may contain the same materials, without damaging layer 12 and first metal 10 is problematic. For example, hydrofluoric (HF) acid is typically used for etching a silicon oxide based mask because it has good selectivity with first metal 10. However, depending on gate dielectric layer 12 material, HF acid could significantly etch gate dielectric layer 12. Silicon nitride based masks have similar problems. It is possible to prevent over etching of gate dielectric layer 12 by using masking material 30 that has a high wet etch selectivity compared to the materials of gate dielectric layer 12 (e.g., silicon oxide or hafnium silicate). However, exposing gate dielectric layer 12 to wet chemicals also can cause various other problems, such as surface roughening, impurity absorption and gate work function modification. Accordingly, it is desirable not to expose gate dielectric layer 12 to the wet chemical during the integration.

The structure as illustrated in FIG. 1E also presents challenges relative to gate formation in subsequent steps (not shown). In particular, the heterogeneous metals (i.e., first metal layer 10 and second metal 40, on the single wafer poses a significant challenge for the gate stack dry etch stopping on gate dielectric layer 12. Since second metal 40 is different on NMOS region 20 and PMOS region 22, the dry etch chemistry has to be different. In order to remove both metals and stop on gate dielectric layer 12, sequential removal of the two metals has to be implemented in the dry etch recipe. This process is particularly difficult because gate dielectric layer 12 on one side of the wafer will be exposed to a dry etch ambient during etching of second metal 40. As a result, penetration of gate dielectric layer 12 is highly likely, leading to recessing of substrate 14. In order to avoid this situation, it is desirable to have the same metal contact gate dielectric layer 12 in both NMOS region 20 and PMOS region 22.

In view of the foregoing, there is a need in the art for a solution to the problems of the related art.

SUMMARY OF THE INVENTION

Methods of forming dual metal gates and the gates so formed are disclosed. A method may include forming a first metal (e.g., NMOS metal) layer on a gate dielectric layer and a second metal (e.g., PMOS metal) layer on the first metal layer, whereby the second metal layer alters a work function of the first metal layer (to form PMOS metal). The method may then remove a portion of the second metal layer to expose the first metal layer in a first region; form a silicon layer on the exposed first metal layer in the first region and on the second metal layer in a second region; and form the dual metal gates in the first and second regions. Since the gate dielectric layer is continuously covered with the first metal, it is not exposed to damage from the metal etch process.

A first aspect of the invention provides a method of forming dual metal gates, the method comprising: forming a first metal layer on a gate dielectric layer and a second metal layer on the first metal layer, wherein the second metal layer alters a work function of the first metal layer; removing a portion of the second metal layer to expose the first metal layer in a first region; forming a silicon layer on the exposed first metal layer in the first region and on the second metal layer in a second region; and forming the dual metal gates in the first and second regions.

A second aspect of the invention provides a method of forming dual metal gates, the method comprising: forming a first metal layer on a gate dielectric layer; forming a second metal layer on the first metal layer, wherein the second metal layer alters a work function of the first metal layer; and forming the dual metal gates without exposing the gate dielectric layer using the first metal layer and the second metal layer.

A third aspect of the invention provides a set of dual metal gates comprising: a first gate including a first metal having a first work function; a second gate including the first metal and a second metal, the second metal altering the first work function to a second work function for the second gate; and a gate dielectric layer under the first gate and the second gate, wherein only the first metal contacts the gate dielectric layer.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 1A-E show a conventional dual metal gate forming process.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 2A:
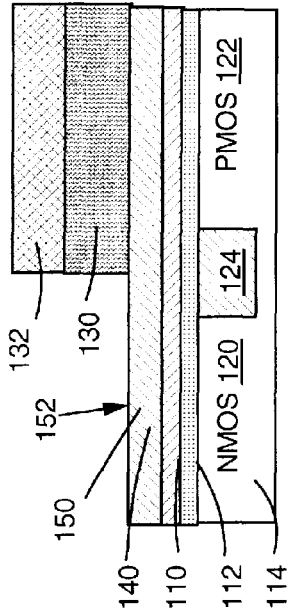
FIGS. 2A-F show a method of forming dual metal gates according to one embodiment of the invention.

Turning to the drawings, FIGS. 2A-2F show one embodiment of a method of forming dual metal gates 100A, 100B (FIG. 2F) (shown without spacers or interconnects). FIG. 2A shows forming a first metal layer 110 on a gate dielectric layer 112 and a second metal layer 140 on first metal layer 110. Both layers are positioned over a gate dielectric layer 112, which is positioned over a substrate 114 having an n-type metal oxide semiconductor (NMOS) region 120 and a p-type metal oxide semiconductor (PMOS) region 122. Regions 120, 122 may be simply designated as for a particular type device, and may not have any structural differences. A trench isolation 124, e.g., of silicon oxide ($SiO_2$) separates regions 120, 122. Gate dielectric layer 112 may include, for example, hafnium silicate (HfSi), hafnium oxide ($HfO_2$), zirconium silicate ($ZrSiO_x$), zirconium oxide ($ZrO_2$), silicon oxide ($SiO_2$) or any other material(s) used as a gate dielectric. Layers 110, 112 may be formed using any now known or later developed deposition technique such as chemical vapor deposition (CVD), low-pressure CVD (LPCVD), plasma-enhanced CVD (PECVD), semi-atmosphere CVD (SACVD), high density plasma CVD (HDPCVD), atomic layer deposition (ALD), etc.

First metal layer 110 and second metal layer 140 are selected such that second metal layer 140 alters a work function of first metal layer 110. That is, elements from second metal layer 140 are mixed with first metal layer 110 during the subsequent semiconductor device processing, primarily during a high temperature anneal and the final work function of first metal layer is altered from that of the material of first metal layer 110. The effect of changing work functions may be attributed to, for example, the changes in material composition, crystalline structure, interfacial reaction with underlying dielectrics, impurity concentration, and oxygen concentration. As illustrated, first metal layer 110 is ultimately used as a gate material for an NMOS device 100A (FIG. 2F) and second metal layer 140 with first metal layer 110 are used as a gate material for a PMOS device 100B (FIG. 2F). In this situation, first metal layer 110 may include material having a work function within an acceptable range of that typically used for an NMOS device 100A (FIG. 2F). For example, first metal layer 110 may include tantalum carbon (TaC), titanium nitride (TiN), hafnium silicide (HfSi), tantalum (Ta) or tantalum carbon nitride (TaCN). Similarly, second metal layer 140 may include material that when combined with first metal layer 110 has a work function within an acceptable range of that typically used for a PMOS device 100B (FIG. 2F). For example, second metal layer 140 may include: tantalum carbon nitride (TaCN), titanium nitride (TiN) or ruthenium (Ru). Illustrative combinations of first metal layer 110 and second metal layer 140, respectively, may include: titanium nitride (TiN) and tantalum carbon nitride (TaCN), hafnium silicide (HfSi) and titanium silicon nitride (TiSiN), tantalum (Ta) and ruthenium (Ru), tantalum carbon nitride (TaCN) and titanium nitride (TiN). Other combinations may exist and are considered within the scope of the invention. It should also be recognized that the material that constitutes first metal layer 110 may be switched. That is, first metal layer 110 may be used to form PMOS device 100B (FIG. 2F), and second metal layer 140 with first metal layer 110 may be used to form NMOS device 100A (FIG. 2F).

Figure 2C:
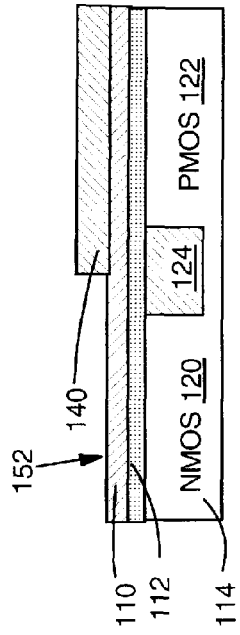
Figure 2E:
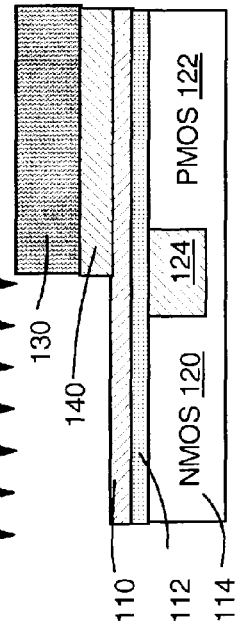
Figure 2B:
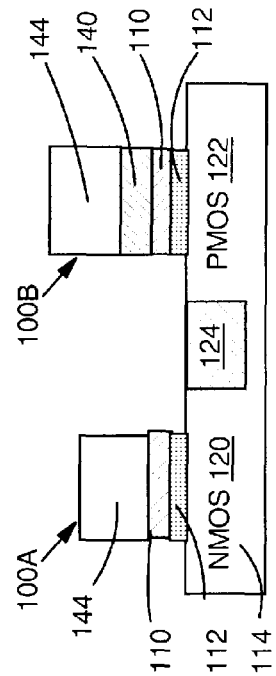
Figure 2D:
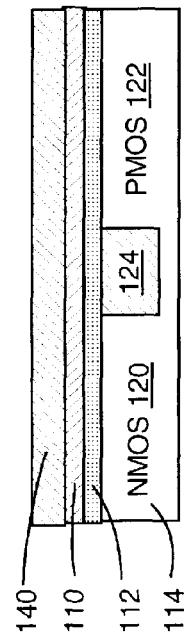
Figure 2F:
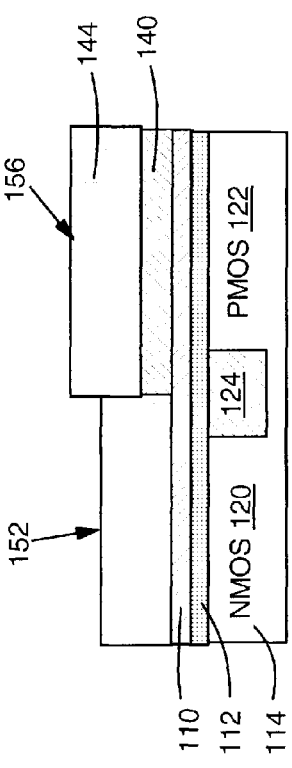

Continuing with the processing, FIGS. 2B-D show a step of removing a portion 150 of second metal layer 140 to expose first metal layer 110 in a first region 152 (FIG. 2D). As illustrated, first region 152 is over NMOS region 120. The removing may include, as shown in FIG. 2B, depositing a masking material 130 and patterning masking material 130 using a photoresist 132. Masking material 130 and photoresist 132 may include any now known or later developed materials compatible for etching second metal layer 140. For example, masking material 130 may include silicon oxide ($SiO_2$) deposited using tetraethyl orthosilicate ($Si(OC_2H_5)_4$) (TEOS), armorphous silicon, or other common hard mask material. FIG. 2C shows etching 154 second metal layer 140 to remove portion 150 (FIG. 2B). FIG. 2D shows removing masking material 130 (FIG. 2C), leaving second metal layer 140 over first metal layer 110 over PMOS region 122. Notice that gate dielectric layer 112 is never exposed during this process, i.e., first metal layer 110 remains intact during removal of second metal layer 140.

FIG. 2E shows forming a silicon layer 144 on exposed first metal layer 110 in first region 152 and on second metal layer 140 in a second region 156. Silicon layer 144 may include any type of silicon material typically used for gate stacks, e.g., polysilicon, polysilicon germanium, etc. Silicon layer 144 may be formed using any now known or later developed technique, e.g., CVD.

FIG. 2F shows forming of dual metal gates 100A, 100B in first and second regions. For example, gates 100A, 100B may be patterned and etched. During this process, gate dielectric layer 112 is never exposed to a dry etch ambient during etching of second metal layer 140. Hence, damage to gate dielectric layer 112 and substrate 114 is avoided. That is, dual metal gates 100A, 100B may be formed using first metal layer 110 and second metal layer 140 without exposing gate dielectric layer 112.

One example of implementation is as follows: deposition of 100 Angstroms (Å) ALD of first metal layer 110 (FIG. 2A) in the form of tantalum carbon nitride (TaCN) on 20 Å of gate dielectric layer 112 in the form of hafnium silicate (HfSiO$_x$). Next, deposition of 100 Å CVD of second metal layer 140 (FIG. 2A) in the form of titanium nitride. Next, deposition of 400 Å of silicon oxide (SiO$_2$) deposited with tetraethyl orthosilicate (Si(OC$_2$H$_5$)$_4$)(TEOS) masking material 130 (FIG. 2B). Lithography and selective etch of masking material 130 (FIG. 2B) to open it in first region 152 is next, as shown in FIG. 2B, followed by etching second metal layer 140 in first region 152 over NMOS region 120. Masking material 130 (FIG. 2C) is then removed, as shown in FIG. 2D. Conventional processing to form set of dual metal gates 100A, 100B completes the illustrative implementation.

FIG. 2F shows the resulting set of dual metal gates 100A, 100B including a first gate 100A including first metal 110 having a first work function, a second gate 100B including first metal 110 and second metal 140, and gate dielectric layer 112 under first gate 100A and second gate 100B. Here, only first metal 110 contacts gate dielectric layer 112. Second metal 140 alters the first work function of first metal 110 to a second work function usable for second gate 100B.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming dual metal gates, the method comprising:
    forming a first metal layer directly over a gate dielectric layer and a second metal layer directly over the first metal layer, wherein the second metal layer substantially covers the first metal layer;
    removing a portion of the second metal layer to expose the first metal layer in a first region;
    forming one silicon layer directly over the exposed first metal layer in the first region and directly over the second metal layer in a second region;
    annealing the first metal layer and the second metal layer within the second region, such that elements of the second metal layer are mixed with the first metal layer and a first work function of the first metal layer within the second region is altered to a second work function, wherein the first work function is different from the second work function; and
    etching to form the dual metal gates in the first and second regions after the forming of the one silicon layer, wherein the first region includes:
        a portion of the gate dielectric layer, a portion of the first metal layer directly over the gate dielectric layer, and a portion of the one silicon layer directly over the first metal layer, the portion of the first metal layer within the first region including the first work function, and
    wherein the second region includes:
        a portion of the gate dielectric layer, a portion of the first metal layer directly over the gate dielectric layer, a portion of the second layer directly over the first metal layer, and a portion of the one silicon layer directly over the second metal layer, the portion of the first metal layer within the second region including the second work function, and wherein a portion of the first metal layer in the second region is prevented from contacting the one silicon layer by the second metal layer.

2. The method of claim 1, wherein one of the dual metal gates is for an n-type metal oxide semiconductor (NMOS) device and the other dual metal gate is for a p-type metal oxide semiconductor (PMOS).

3. The method of claim 1, wherein a combination of the first metal layer and the second metal layer, respectively, are selected from the group consisting of: titanium nitride (TiN) and tantalum carbon nitride (TaCN), hafnium silicide (HfSi) and titanium silicon nitride (TiSiN), tantalum (Ta) and ruthenium (Ru), tantalum carbon nitride (TaCN) and titanium nitride (TiN).

4. The method of claim 1, wherein the first metal layer includes one of: tantalum carbon (TaC), titanium nitride (TiN), hafnium silicide (HfSi), tantalum (Ta) and tantalum carbon nitride (TaCN), and the second metal layer includes one of: tantalum carbon nitride (TaCN), titanium nitride (TiN) and ruthenium (Ru).

5. The method of claim 1, wherein the gate dielectric layer includes one of:
    hafnium silicate (HfSiO$_x$), hafnium oxide (HfO$_2$), zirconium silicate (ZrSiO$_x$), zirconium oxide (ZrO$_2$) and silicon oxide (SiO$_2$).

6. The method of claim 1, wherein the first region is over a region for an n-type metal oxide semiconductor (NMOS).

7. The method of claim 1, wherein the first metal layer remains intact during the removing step.

8. The method of claim 1, wherein the first region and the second region are formed over a substrate, and wherein the first region is formed over a portion of the substrate for an n-type metal oxide semiconductor (NMOS) and the second region is formed over a portion of the substrate for a p-type metal oxide semiconductor (PMOS).

9. The method of claim 8, wherein the forming of the dual metal gates includes etching to expose a portion of the NMOS and the PMOS.

10. A method of forming dual metal gates, the method comprising:
    forming a gate dielectric layer over a substrate having an n-type metal oxide semiconductor (NMOS) region and a p-type metal oxide semiconductor (PMOS) region;
    forming a first metal layer directly over the gate dielectric layer;
    forming a second metal layer directly over the first metal layer, wherein the second metal layer alters a work function of the first metal layer;

removing a portion of the second metal layer to expose the first metal layer in a first region above the NMOS region;

forming one silicon layer directly over the exposed first metal layer in the first region above the NMOS region and directly over the second metal layer in a second region above the PMOS region;

annealing the first metal layer and the second metal layer within the second region above the PMOS region, such that elements of the second metal layer are mixed with the first metal layer and a first work function of the first metal layer within the second region above the PMOS region is altered to a second work function, wherein the first work function is different from the second work function; and etching to form the dual metal gates in the first and second regions, wherein the etching exposes a portion of the NMOS region and a portion of the PMOS region, with the first region above the NMOS region includes:

a portion of the gate dielectric layer, a portion of the first metal layer directly over the gate dielectric layer, and a portion of the one silicon layer directly over the first metal layer, the portion of the first metal layer within the first region including the first work function, and wherein the second region above the PMOS region includes:

a portion of the gate dielectric layer, a portion of the first metal layer directly over the gate dielectric layer, a portion of the second metal layer directly over the first metal layer, and a portion of the one silicon layer directly over the second metal layer, the portion of the first metal layer within the second region including the second work function, and wherein a portion of the first metal layer in the second region is prevented from contacting the one silicon layer by the second metal layer.

11. The method of claim 10, wherein a combination of the first metal layer and the second metal layer, respectively, are selected from the group consisting of: titanium nitride (TiN) and tantalum carbon nitride (TaCN), hafnium silicide (HfSi) and titanium silicon nitride (TiSiN), tantalum (Ta) and ruthenium (Ru), tantalum carbon nitride (TaCN) and titanium nitride (TiN).

12. The method of claim 10, wherein the first metal layer includes one of: tantalum carbon (TaC), titanium nitride (TiN), hafnium silicide (HfSi), tantalum (Ta) and tantalum carbon nitride (TaCN), and the second metal layer includes one of: tantalum carbon nitride (TaCN), titanium nitride (TiN) and ruthenium (Ru).

13. The method of claim 10, wherein the gate dielectric layer includes one of:

hafnium silicate (HfSiO$_x$), hafnium oxide (HfO$_2$), zirconium silicate (ZrSiO$_x$), zirconium oxide (ZrO$_2$) and silicon oxide (SiO$_2$).

14. A method of forming dual metal gates, the method comprising:

forming a first metal layer on a gate dielectric layer and a second metal layer on the first metal layer, wherein the second metal layer alters a work function of the first metal layer;

removing a portion of the second metal layer to expose the first metal layer in a first region;

forming a silicon layer on the exposed first metal layer in the first region and on the second metal layer in a second region, wherein a portion of the first metal layer in the second region is prevented from contacting the silicon layer by the second metal layer; and forming the dual metal gates in the first and second regions.

* * * * *